United States Patent [19]
Goetz et al.

[11] Patent Number: 5,427,638
[45] Date of Patent: Jun. 27, 1995

[54] LOW TEMPERATURE REACTION BONDING

[75] Inventors: George G. Goetz, Ellicott City; Warren M. Dawson, Baltimore, both of Md.

[73] Assignee: AlliedSignal Inc., Morris Township, N.J.

[21] Appl. No.: 161,039

[22] Filed: Dec. 3, 1993

Related U.S. Application Data

[63] Continuation-in-part of Ser. No. 894,142, Jun. 4, 1992, abandoned.

[51] Int. Cl.$^6$ .............................................. B32B 31/00
[52] U.S. Cl. ...................... 156/153; 156/281; 156/273.9; 148/DIG. 22; 427/539; 427/573
[58] Field of Search .................. 156/153, 272.2, 281, 156/273.9; 148/DIG. 12, DIG. 22, DIG. 83, DIG. 135; 437/974; 427/527, 539, 573

[56] References Cited

U.S. PATENT DOCUMENTS

| | | | |
|---|---|---|---|
| H1,164 | 4/1993 | Wade, Jr. et al. | 156/272.2 |
| 3,679,985 | 7/1972 | Fang et al. | 330/4.6 |
| 4,170,662 | 10/1979 | Weiss et al. | 427/38 |
| 4,274,483 | 6/1981 | Cottone et al. | 165/153 |
| 4,345,985 | 8/1982 | Tohda et al. | 204/192 |
| 4,457,972 | 7/1984 | Griffith et al. | 156/272.2 |
| 4,458,346 | 7/1984 | Mitsuyu et al. | 369/126 |
| 4,547,432 | 10/1985 | Pitts et al. | 428/448 |
| 4,638,552 | 1/1987 | Shimbo et al. | 156/273.9 |
| 4,765,860 | 8/1988 | Ueno et al. | 156/272.6 |
| 4,824,008 | 4/1989 | Luszcz et al. | 228/121 |
| 4,849,247 | 7/1989 | Scanlon et al. | 156/272.2 |
| 4,884,737 | 12/1989 | Newkirk et al. | 228/121 |
| 4,886,681 | 12/1989 | Clabes et al. | 427/38 |
| 4,917,843 | 4/1990 | Gyarmati et al. | 264/60 |
| 4,957,771 | 9/1990 | Enloe | 427/38 |
| 4,960,736 | 10/1990 | Luxzcz et al. | 501/127 |
| 4,983,251 | 1/1991 | Haisma et al. | 156/630 |
| 5,008,723 | 4/1991 | van der Have | 357/23.7 |
| 5,010,036 | 4/1991 | Calviello et al. | 437/173 |
| 5,232,870 | 8/1993 | Ito et al. | 148/DIG. 12 |

FOREIGN PATENT DOCUMENTS 3091227 4/1991 Japan ........................ 148/DIG. 12

OTHER PUBLICATIONS

Lasky et al., Silicon-On-Insulator (SOI) by Bonding and Etch-Back, Proceedings of 1985 IEDM 684.
J. B. Lasky, Wafer Bonding for Silicon-on-Insulator Technologies, Jan. 1986, *Applied Physics Letters* 48, pp. 78-80.
W. P. Maszara, et al, "Bonding of Silicon Wafers for Silicon-on-Insulator", Nov. 1988, *J. Applied Physics*, pp. 4943–4950.
Rossnagle, S. M. ed *Handbook of Plasma Processing Technology* Noyes Publications, Park Ridge, N.J. (1990) pp. 206-215.
G. G. Goetz "Generalized Reaction Bonding" The First International Symposium on Semiconductor Wafer Bonding Science, Technology and Applications—Oral Presentation Nov. 14, 1991.

Primary Examiner—Chester T. Barry
Attorney, Agent, or Firm—Howard G. Massung

[57] ABSTRACT

A method for reaction bonding surfaces at low temperatures in which polished and cleaned surfaces are bombarded with a mixture of oxygen and fluorine ions to produce activated surfaces. The activated surfaces are then cleaned to remove particulates, then contacted at room temperature to affect a reaction bond therebetween. The bond energy of the reaction bonded surfaces increase with time at room temperature. The rate at which the bond energy of the reaction bonded surfaces increases may be enhanced by moderate heating at a low temperature below a temperature which would be detrimental to any part of the reaction bonded structure. A satisfactory bond energy for silicon wafers can be achieved in four hours at room temperature and in less than 10 minutes at 50° C.

19 Claims, 3 Drawing Sheets

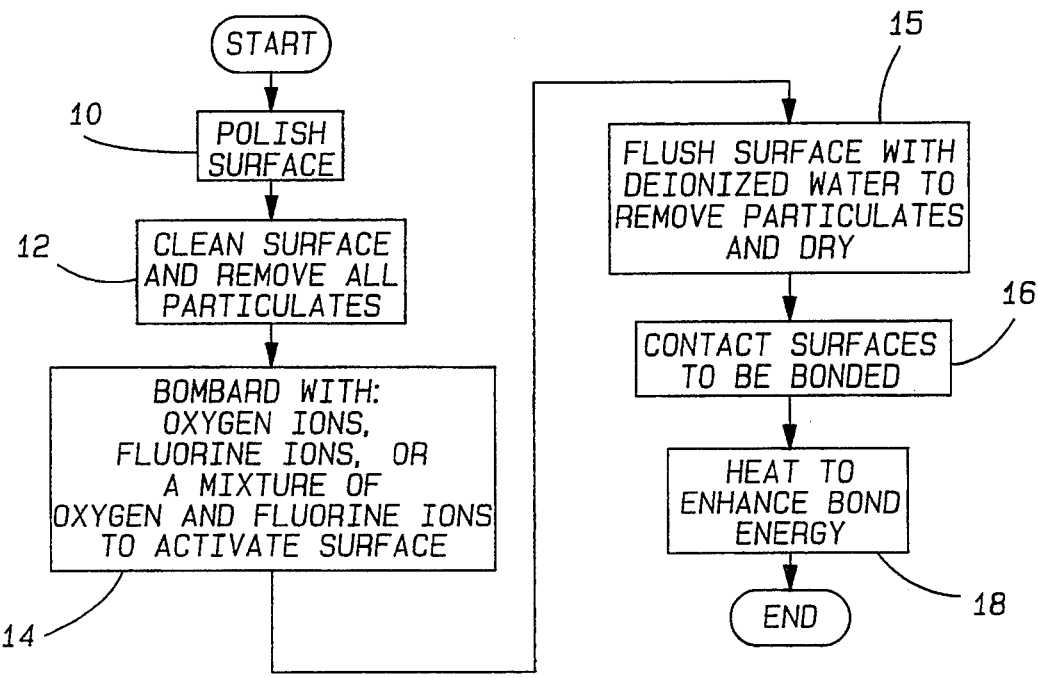
Fig-1
Fig-2
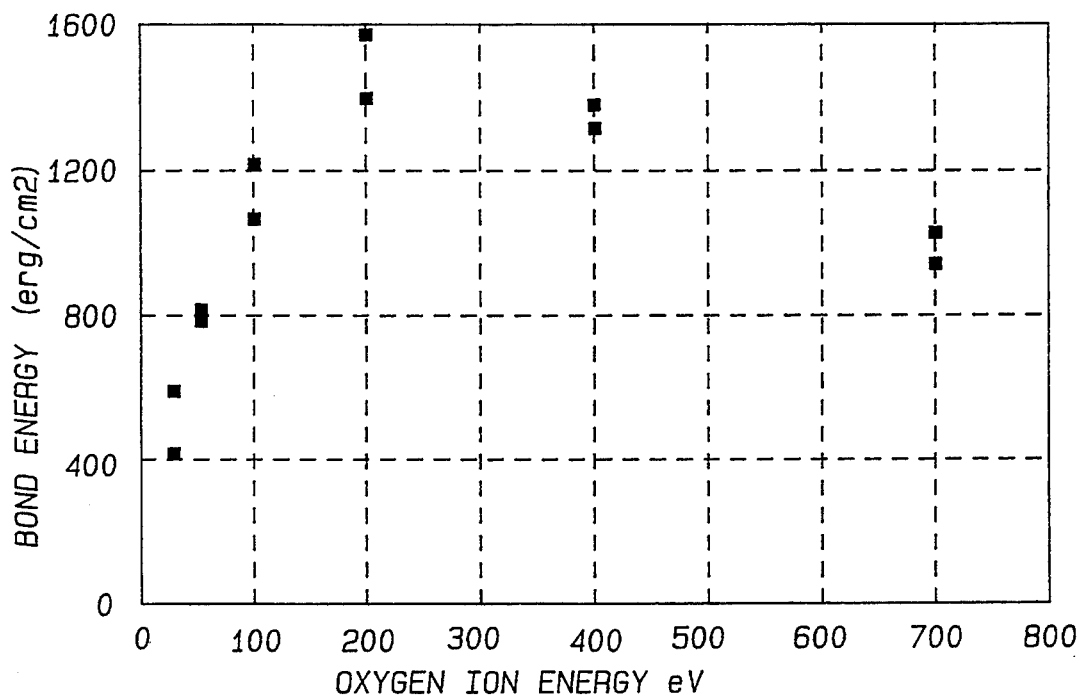

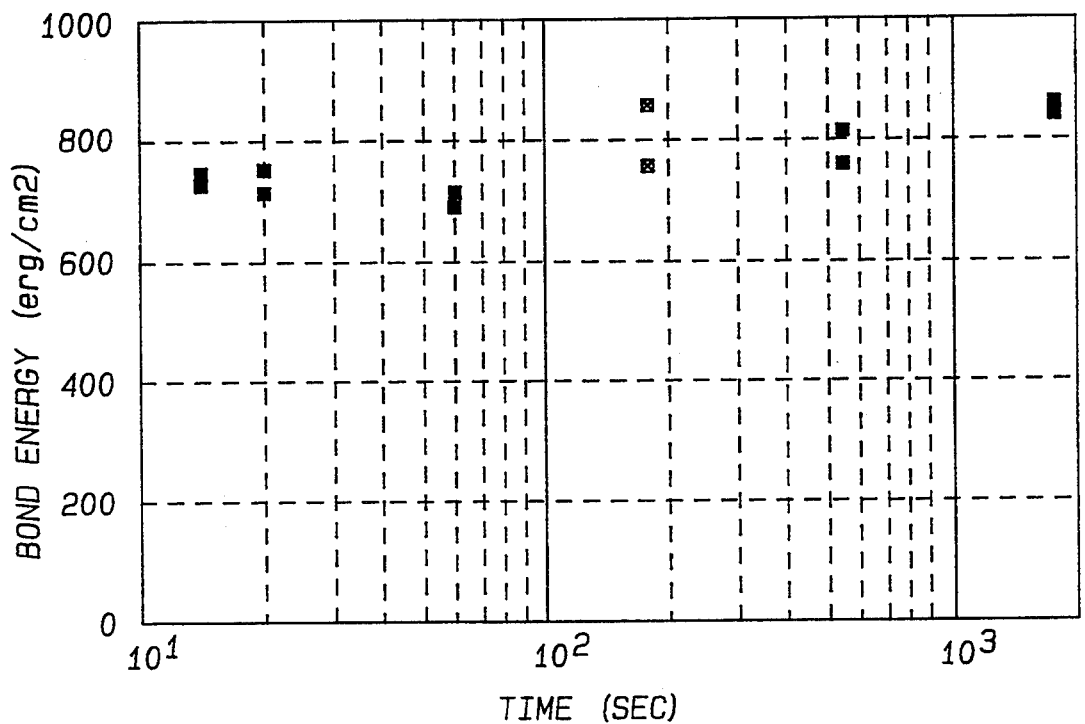
Fig-3
Fig-4
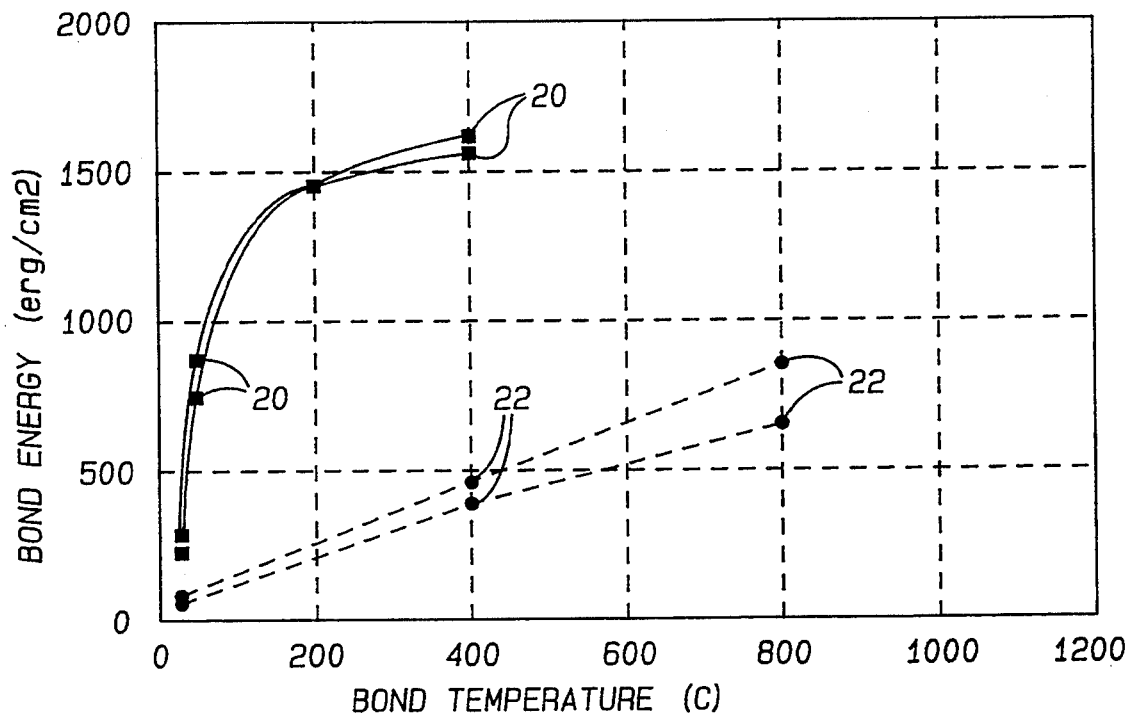

LOW TEMPERATURE REACTION BONDING

CROSS-REFERENCE TO RELATED APPLICATION

This patent application is a continuation-in-part of patent application Ser. No. 894,142, entitled "Improved Reaction Bonding Through Activation By Ion Bombardment" filed Jun. 4 1992, now abandoned.

TECHNICAL FIELD

The invention is related to the field of bonding semiconductor materials, oxides, nitrides and glasses to each other and, in particular, to a low temperature reaction bonding method which is obtained through surface activation by oxygen and fluorine ion bombardment.

BACKGROUND ART

The ability to create direct bonds between solid objects has been useful and valuable. There are two basic requirements for achieving useful bonds. First, a sizeable percentage of the atoms on the touching surfaces must be brought into intimate contact with each other and second, the atoms of the touching surfaces must react with each other. Until recent times, the intimate contact required for solid-to-solid reaction bonding could only be achieved when a glass was one of the solids.

In these types of bonds, heat and pressure were used to produce sufficient viscous flow to satisfy the first bonding requirement and undoubtedly the heat energy also promoted the reaction of the atoms of the two surfaces.

The use of an intermediate adhesive layer to bond solid objects together has been a long standing alternative to direct solid-to-solid bonding. The advantage of intermediate adhesives is that these adhesives can have a low viscosity which reduces the requirements on the morphology of the surfaces being bonded or the viscosity of the solid being bonded. Also, the temperature required for the desired surface reaction usually is relatively low. However, adhesives often have a large negative impact on the characteristics of the bonded structure.

In the semiconductor and allied fields where it is desirable and often necessary to maintain the physical and electrical properties of the respective solids at their bonded interface, the use of intermediate adhesives are generally froth with problems and are avoided whenever and wherever possible.

The development of modern semiconductor processing technology has made it possible to produce surfaces smooth enough and clean enough to satisfy the first requirement for solid-to-solid bonding with only elastic deformation of the contacting surfaces. This was first reported by J. B. Lasky et al., 1985 Proceedings IEDM, page 684, for oxidized silicon wafers. This technique permitted the solid-to-solid bonding of semiconductor materials without any of the problems encountered through the use of an adhesive. A key ingredient of this approach is an initial solid-to-solid bonding at room temperature generally called "contacting." This contacting holds the surfaces in intimate contact with each other in a clean high temperature furnace without the complications and potential contamination encountered when externally applied forces are used to hold the surfaces together. It was quickly recognized that this technology also had potential for manufacturing sensors with silicon and quartz structures. However, utilization of the full potential of solid-to-solid bonding to create structures with unique combinations of mechanical, electrical, optical and thermal properties has been slow to develop, and in many practical applications, sufficient bond energy was not obtainable at bonding temperatures that were not detrimental to some part of the total structure.

The invention is an improvement to solid-to-solid reaction bonding by achieving much higher bond strengths at low temperatures which can increase with time to an acceptable value.

SUMMARY OF THE INVENTION

In the method for enhancing the bond energy of solid-to-solid reaction bonding, the surfaces to be bonded are polished to a roughness in the order of atomic dimensions then cleaned to remove contaminants and particulates. The cleaned surfaces are then ion bombarded in a gas plasma to activate the surface. For many gases ($H_2$, $N_2$, $O_2$, $CF_4$, $SF_6$, $CF_4+O_2$, $SF_6+O_2$, etc.), there are conditions which yield some enhancement of bond energy, but sizeable increases have only been demonstrated for gas plasmas containing either oxygen, fluorine, or a mixture of oxygen and fluorine. The highest bond energies for low temperatures have been obtained with oxygen and fluorine mixtures. After ion bombardment, the activated surfaces are given a final high pressure water jet flush to remove any particulates, spun dried, and then contact bonded. The bond energy between the contacted surfaces can increase thereafter, at temperatures as low as room temperature, to a satisfactory value in as little as four hours. There is a time-temperature tradeoff such that at 200° C. a high bond energy can be obtained in less than 10 minutes.

Further advantages of activating the surfaces to be reaction bonded by oxygen and fluorine ion bombardment may be obtained from reading the specification in conjunction with the appended figures.

BRIEF DESCRIPTION OF THE DRAWINGS

FIG. 1 is a flow diagram of the process for enhancing the bond energy of the surfaces to be bonded;

FIG. 2 is a graph showing the bond energy as a function of the energy of the oxygen ions bombarding the surface;

FIG. 3 is a graph showing the variation of bond energy as a function of bombardment time;

FIG. 4 shows an example of the difference in the bond energy of surfaces activated by oxygen plus fluorine ion bombardment and surfaces activated by water after 10 minutes as a function of bonding temperature;

DETAILED DESCRIPTION OF THE PREFERRED EMBODIMENT

Figure 5:
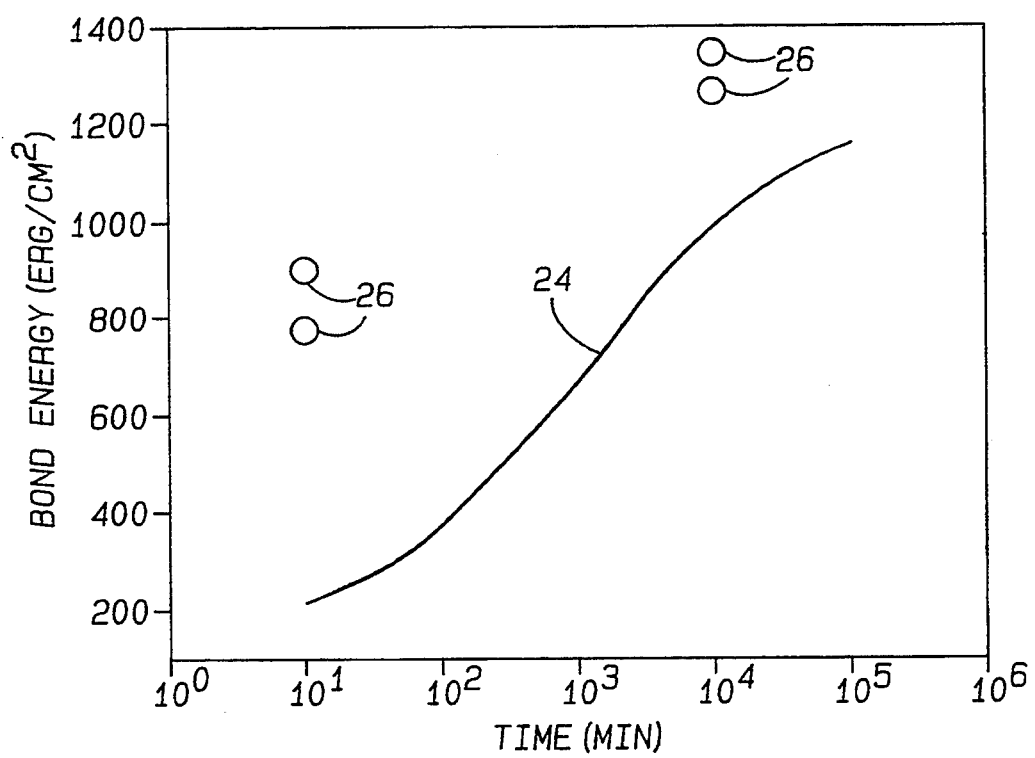
FIG. 5 is a graph showing the increase in bond energy, at room temperature, as a function of time.

The invention is directed to enhancing the reaction bonding between $SiO_2$ or $Si_3N_4$ coated semiconductor materials such as silicon (Si), indium phosphide (InP), gallium arsenide (GaAs), etc. Bonding enhancement has also been demonstrated for all glasses tested, and it is expected that the general procedures involved will apply to any two surfaces that contain atoms which react with each other. The details of the process will be discussed relative to the flow diagram illustrated in FIG. 1. As indicated in block 10, the substrates are first polished so that their surface roughness is in the order of atomic dimensions. A surface roughness of the order of atomic dimensions is less than 1 nanometer and preferably less than one-half nanometer. The polished surface is then cleaned, as indicated by block 12, using standard cleaning methods established for cleaning semiconductor parts to remove contaminants and particulates from the surfaces to be reaction bonded. The use of hydrofluoric acid dips normally used in standard cleaning methods should be avoided for surfaces which may be etched by the hydrofluoric acid.

In the instances where the surface to be bonded is a thin oxide layer grown on the polished surface, it has been found that the thin oxide layer assumes the morphology of the polished substrate and does not have to be polished. Thin deposited films of reactive metals or insulators also follow the substrate morphology and can be bonded without further polishing.

The substrate is then placed in a vacuum chamber on a RF powered electrode. Normally, a pressure of approximately 50 millitorr within the vacuum chamber has been used, but it is expected that any pressure that can support an RF plasma is a possibility. An RF induced DC bias on the substrate accelerates the positive ions in the plasma toward the surfaces to be bonded with an energy determined by the magnitude of the bias. As can be seen in FIG. 2, the maximum bond energies for the conditions examined with an oxygen plasma, yielded maximum bond energies with 200 V bias. The bond energies dropped markedly for biases below 100 V. Plasmas with fluorine containing gases have yielded much higher bond energies with low DC bias. For example, a $SF_6$ plasma activation with a 14 V substrate bias yielded bond energies almost as large as a 200 V bias with a pure oxygen plasma activation. This difference can be critical when it is important to either minimize radiation damage in an insulator or minimize contamination due to sputtering in the chamber.

There is little evidence that a total ion dose much greater than several times the number of surface atoms is of benefit. This is evident from the graph shown in FIG. 3, there is only a small difference in the resultant bond energies for an oxide exposed to a 400 eV oxygen ion flux as the ion bombardment time varied from 13 seconds to 1,800 seconds. The 13 second minimum bombardment time of FIG. 3 does not represent a lower limit but simply represents the minimum time limit of the ionization equipment used. Calculations indicate that an oxygen ion dose equivalent to the surface atom density of the substrate would be received by the surface in a time period in the order of one (1) second.

The method of producing the oxygen and fluorine ions may be a DC or RF voltage, or any other type of ionization mechanism known in the art, provided they are accelerated to the indicated bombarding energies.

After the surfaces to be bonded have been activated by oxygen ion bombardment, fluorine ion bombardment or a mixture of oxygen and fluorine ion bombardment, the surfaces are given a high pressure deionized water flush to remove any particulates, spun dried, as indicated by block 15, then contacted to each other, as indicated by block 16. Heating to a predetermined temperature, as indicated by block 18, increases the bond energy. FIG. 4 shows the bond energies of the reaction bonded surfaces as a function of the temperature to which the bonded surfaces were heated for 10 minutes after contacting at room temperature. The bond energies of the surfaces which have been activated by bombardment with a mixture of oxygen and fluorine ion are indicated by the blocks 20, while the range of bond energies of surfaces activated by a standard water activation process are indicated by the circles 22. As is evident from the data shown in FIG. 4, the bond energy for the surfaces activated by oxygen and fluorine ion bombardment are over 3 times greater than the bond energies of surfaces activated by the standard water activation over most of the bonding temperature range examined. Effectively, reaction bonded components in which the surfaces were activated by bombardment with oxygen ions, fluorine ions or a mixture of oxygen and fluorine ions, may be bonded at significantly lower temperatures down to room temperature.

In general, the lower the bonding temperature, the greater the relative enhancement by the addition of fluorine ions. This trend holds down to room temperature with the results that some surfaces that are a little too rough or non-flat to be contacted with standard activation may be contacted after fluorine ion activation. Carbon tetra-fluorine ($CF_4$), trifluoromethane ($CHF_3$) and sulfur hexafluoride ($SF_6$) have been used as a source of fluorine ions in the ion bombardment activation. When oxygen is mixed with the above gases, the oxygen not only supplies oxygen ions to bombard and react with the substrate surface along with fluorine ions, but it also reacts with the carbon in the $CF_4$ and $CHF_3$ gases or the sulfur in the $SF_6$ gas and frees more fluorine.

The procedure for activating the surface to enhance the bond energy using a mixture of oxygen and fluorine ions is the same as the procedure set forth in FIG. 1, with the limitation that the surfaces are bombarded with both oxygen and fluorine ions. The optimum ratio of oxygen ions to fluorine ions depends upon several factors such as the composition of the surfaces, their roughness, the bonding temperature, etc. No effort has been made to determine what the optimum ratio of oxygen to fluorine ions may be. However, we have found clear bond enhancements with $SiO_2$, $Si_3N_4$ and aluminosilicate glass surfaces for bonding temperatures from room temperature to 400° C. with estimated oxygen ion to fluorine ion ratios of 4 to 1.

Surfaces activated by oxygen and fluorine ion bombardment may also be reaction bonded at room temperature. It has been experimentally verified that the bond energy of the surfaces activated by oxygen and fluorine ion bombardment will progressively increase at room temperature (22° C.) as a function of time. Curve 24 shown on the graph of FIG. 5 shows the increase in bond energy of reaction bonded silicon dioxide ($SiO_2$) surfaces activated by oxygen and fluorine ion bombardment. In less than four hours (240 minutes), the bond energy had increased to a value ($\approx 400$ erg/cm$^2$) required for satisfactory silicon wafer bonding. As is obvious from curve 24, the bond energy will increase to 600 erg/cm$^2$ in 24 hours (1440 minutes) and will double to 800 erg/cm$^2$ in approximately 120 hours ($\approx 7 \times 10^3$ minutes). Because the bond energy eventually increases to values over half that for bulk SiO, it is clear that the room temperature bond is very reliable.

As indicated by the circles 26, the rate at which the bond energy of the reaction bonded surfaces activated by oxygen and fluorine ion bombardment increases may be enhanced by a low temperature bonding at approximately 50° C. As illustrated by the points shown in FIG. 4, higher bonding energies may be obtained at higher bonding temperatures, but relative improvement observed above 200° C. is not significant. However, if higher bond energies or shorter times are required, bonding at a low temperature above room temperature may be used such as bonding at a temperature of approximately 50° C. as illustrated by the circle 26 in FIG. 5.

The bond energy between the activated surfaces increases with an increase in the total flux of oxygen and fluorine ions impinged on the surfaces up to a value approximately equivalent to a coverage of several monolayers. As shown in FIG. 3, a further increase of the numbers of the ions impinging on the surfaces do not further enhance the bond energy. Similar to the increase in bond energy with an increase in bombardment energy for oxygen ions as shown on FIG. 2, there also is an increase in bond energy with the bombardment energy of the mixture of oxygen and fluorine ions. However, the bombardment energy for producing a maximum bond energy when using a mixture of oxygen and fluorine ions is lower and varies as a function of the material of the surface and the percentage of fluorine in the oxygen fluorine ion mixture. Preferably, the bombardment energy of the oxygen and fluorine ions is in the range from 10 to 400 eV. However, higher bombardment energy may be used. Because of the potential for contamination from materials sputtered by high energy ions, for certain applications, it is preferred that the ion energies be approximately 20 eV.

The advantage of being able to reaction bond at temperatures between room temperature and 200° C. is that it permits the bonding of two materials whose difference in thermal expansion is sufficiently large so as to produce mechanical stresses when reaction bonded at elevated temperatures. These mechanical stresses weaken the resultant bond. It also permits the use of materials which in some way may deteriorate at the higher bonding temperatures. This invention, because the reaction bond can take place at a low temperature, removes, these limitations and permits the reaction bonding of materials not previously compatible with reaction bonding.

While the best mode for carrying out the invention has been described in detail, those familiar with the art to which this invention relates will recognize various alternative designs and embodiments for practicing the invention as defined by the following claims.

What is claimed is:

1. A method for reaction bonding solid surfaces at a low temperature comprising the steps of:
   polishing each solid surface to be reaction bonded to have a maximum roughness of the order of atomic dimensions to produce polished surfaces;
   cleaning each of said polished surfaces to remove contaminants and particulates to produce cleaned surfaces;
   ion bombarding said cleaned surfaces with a mixture of oxygen and fluorine ions having an energies preselected to produce activated surfaces; and
   placing said activated surfaces in physical contact with each other at room temperature to reaction bond said activated surfaces.

2. The method of claim 1 further including the step of storing said reaction bonded surfaces at room temperature to increase a bond energy between said activated surfaces.

3. The method of claim 1 wherein said reaction bonded surfaces are part of a structure having different parts which may deteriorate at elevated temperatures, said method further comprising the step of heating said reaction bonded surfaces to a temperature which is hot detrimental to any part of said structure.

4. The method of claim 1 wherein said step of polishing produces surfaces having a roughness of less than 1 nanometer.

5. The method of claim 1 wherein said step of ion bombarding includes the step of bombarding said cleaned surfaces using oxygen and fluorine ions having energies preferably in the range from 10 to 400 eV.

6. The method of claim 1 wherein said step of ion bombardment includes the step of oxygen and fluorine ion bombardment with ions having energies of approximately 20 eV to inhibit sputtering, reactive ion etching and radiation damage.

7. The method of claim 1 wherein said step of ion bombarding includes the steps of:
   placing said cleaned surfaces in an ion bombardment chamber having a reduced pressure oxygen atmosphere;
   adding a predetermined quantity of a gas containing fluorine to said oxygen atmosphere;
   ionizing said oxygen and said gas containing fluorine to produce oxygen ions and fluorine ions; and
   bombarding said cleaned surfaces with said oxygen and fluorine ions having preselected energies to produce said activated surfaces.

8. A method for reaction bonding two surfaces at a low temperature comprising the steps of:
   polishing each of the two surfaces to be reaction bonded to have a roughness less than a predetermined roughness;
   cleaning said surfaces to remove contaminants and particulates which would interfere with reaction bonding;
   placing said cleaned surfaces in an ion bombardment chamber having a reduced pressure oxygen atmosphere containing a predetermined quantity of a gas containing fluorine;
   ionizing said oxygen and said gas containing fluorine to produce oxygen and fluorine ions;
   accelerating said oxygen ions and said fluorine ions toward said surfaces with a predetermined energy;
   bombarding said surfaces with said oxygen and fluorine ions having energies selected to produce activated surfaces; and
   contacting said activated surfaces at room temperature to produce a reaction bond therebetween.

9. The method of claim 8 wherein said step of placing includes the step of placing said two surfaces in said ion bombardment chamber having a reduced pressure oxygen atmosphere containing a gas selected from the group of gases consisting of $CF_4$, $CHF_3$, $CF_6$ and $SF_6$.

10. The method of claim 8 wherein said step of polishing includes the step of polishing each surface to a roughness of the order of magnitude equal to atomic dimensions.

11. The method of claim 8 wherein said step of accelerating said oxygen and fluorine ions includes the step of accelerating said oxygen and fluorine ions to preferably have an energy less than 400 eV.

12. The method of claim 11 wherein said step of accelerating said oxygen and fluorine ions includes the step of accelerating said oxygen and fluorine ions to have an energy of approximately 20 eV to inhibit sputtering, reactive ion etching, and radiation damage.

13. The method of claim 8 wherein said reaction bonded surfaces are part of a structure having components which may deteriorate at temperatures above a predetermined temperature, said method further comprising the step of heating said structure at a temperature less than said predetermined temperature to enhance the bonding energy of said reaction bonded surfaces.

14. A method for increasing the reaction bond energy between two surfaces at a low temperature comprising the steps of:

polishing each of the two surfaces to be reaction bonded to have a roughness less than a predetermined roughness;

cleaning said two surfaces to remove contaminants and particulates which would interfere with reaction bonding;

placing said cleaned surfaces in an ion bombardment chamber having a reduced pressure atmosphere of oxygen and a gas containing fluorine;

ionizing said oxygen and gas containing fluorine to generate oxygen and fluorine ions;

accelerating said oxygen and fluorine ions toward said cleaned surfaces with a predetermined energy;

bombarding said cleaned surfaces with said oxygen and fluorine ions to produce activated surfaces;

reaction bonding said activated surfaces; and storing said reaction bonded surfaces for a preselected time at said low temperature to increase the bond energy of said reaction bonded activated surfaces to a desired minimum value.

15. The method of claim 14 wherein said bonded surfaces are part of a structure having at least one component which may deteriorate at temperatures above a limiting temperature, said step of storing further includes the step of heating said structure to a temperature below said limiting temperature to enhance said reaction bond.

16. The method of claim 15 wherein said step of accelerating includes the step of accelerating said oxygen and fluorine ions towards said cleaned surfaces with an energy preferably between 10 and 400 eV.

17. The method of claim 15 wherein said step of accelerating includes the step of accelerating said oxygen and fluorine ions toward said cleaned surfaces with an energy of approximately 20 eV.

18. The method of claim 15 wherein said step of storing includes the step of storing said reaction bonded surfaces at room temperature for at least 4 hours to increase the bond energy to a desired minimum value.

19. The method of claim 14 wherein said low temperature is room temperature.

* * * * *